United States Patent
Liu et al.

(10) Patent No.: US 10,615,188 B2
(45) Date of Patent: Apr. 7, 2020

(54) ARRAY SUBSTRATE AND MANUFACTURING METHOD THEREOF

(71) Applicant: AU Optronics Corporation, Hsin-Chu (TW)

(72) Inventors: Chan-Jui Liu, Hsin-Chu (TW); Yu-Ling Lin, Hsin-Chu (TW); Chien-Hsun Shan, Hsin-Chu (TW); Jia-Hua Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 164 days.

(21) Appl. No.: 15/374,379

(22) Filed: Dec. 9, 2016

(65) Prior Publication Data

US 2017/0207253 A1    Jul. 20, 2017

(30) Foreign Application Priority Data

Jan. 19, 2016 (TW) .............................. 105101598 A

(51) Int. Cl.
*H01L 27/12* (2006.01)
*H01L 29/786* (2006.01)
(Continued)

(52) U.S. Cl.
CPC ........ *H01L 27/1255* (2013.01); *H01L 27/124* (2013.01); *H01L 27/1222* (2013.01);
(Continued)

(58) Field of Classification Search
CPC .......... H01L 27/1255; H01L 29/78618; H01L 27/1248; H01L 27/1259; H01L 27/1222; H01L 29/78675; H01L 29/66757; H01L 2924/0002; H01L 2924/00; H01L 2924/00014; H01L 23/66; H01L 2224/131; H01L 23/5227; H01L 2924/014; H01L 23/528; H01L 25/0657; H01L 2224/16225; G02F 1/1368; G02F 1/133514;
(Continued)

(56) References Cited

U.S. PATENT DOCUMENTS 7,863,120 B2    1/2011   Chae
7,939,828 B2 *  5/2011   Chen .................. H01L 27/1214
                                                      257/59

(Continued)

FOREIGN PATENT DOCUMENTS

CN      1964056 A      5/2007
CN    104009043 A      8/2014

OTHER PUBLICATIONS

State Intellectual Property Office of the People's Republic of China, "Office Action", dated Apr. 19, 2018.

*Primary Examiner* — Robert G Bachner
(74) *Attorney, Agent, or Firm* — WPAT, PC

(57) ABSTRACT

The present invention provides an array substrate and a manufacturing method thereof. Etching stop patterns or auxiliary conductive patterns of a patterned auxiliary conductive layer are disposed corresponding to heavily doped regions of a patterned semiconductor layer, and source/drain electrodes may be electrically connected to the heavily doped regions via the etching stop patterns or the auxiliary conductive patterns. The production yield and the uniformity of electrical properties may be enhanced accordingly.

23 Claims, 12 Drawing Sheets

(51) Int. Cl.
*H01L 29/66* (2006.01)
*H01L 29/417* (2006.01)

(52) U.S. Cl.
CPC ...... *H01L 27/1248* (2013.01); *H01L 27/1259* (2013.01); *H01L 29/41733* (2013.01); *H01L 29/66757* (2013.01); *H01L 29/78618* (2013.01); *H01L 29/78621* (2013.01); *H01L 29/78675* (2013.01)

(58) Field of Classification Search
CPC ......... G02F 1/33305; G02F 11/136286; G02F 2201/123; H01F 2027/2809; H01F 27/2804; H01F 17/0013; H01F 2017/002; H01F 2017/004; H01F 5/003; H01F 17/0006; H01F 2017/0086; H01F 2017/0053
See application file for complete search history.

(56) References Cited

U.S. PATENT DOCUMENTS

| | | | |
|---|---|---|---|
| 2004/0129943 A1* | 7/2004 | Yoo | G02F 1/136227 257/72 |
| 2007/0103610 A1 | 5/2007 | Lee et al. | |
| 2016/0079429 A1* | 3/2016 | Ellinger | H01L 29/7869 257/43 |
| 2017/0062484 A1* | 3/2017 | Hsu | H01L 27/1237 |

\* cited by examiner

ARRAY SUBSTRATE AND MANUFACTURING METHOD THEREOF

BACKGROUND

Technical Field

The present invention relates to an array substrate and a manufacturing method thereof, and in particular, to an array substrate that is electrically connected to a source/drain electrode and a heavily doped region by using an etching stop pattern or auxiliary conductive pattern of a patterned auxiliary conductive layer and a manufacturing method thereof.

Related Art

Because a low temperature polycrystalline silicon (LTPS) thin-film transistor assembly has a property of relatively high mobility, the LTPS thin-film transistor assembly theoretically has better electrical property performance than that of an amorphous silicon thin-film transistor assembly. In an ordinary top gate LTPS thin-film transistor assembly structure, a source/drain electrode needs to pass through a contact hole in a dielectric layer, such as a silica layer, to come into direct contact with and be directly connected to doped polycrystalline silicon. However, when the contact hole is formed in the dielectric layer in an etching manner, if dry etching having a relatively low etch selectivity ratio is adopted, it would be easy to damage the doped polycrystalline silicon and further affect a state that the source/drain electrode is in direct contact with or is directly connected to the doped polycrystalline silicon. In another aspect, if the contact hole in the dielectric layer is defined by means of wet etching having a relatively high etch selectivity ratio, although it is less likely to damage the polycrystalline silicon, the wet etching has a disadvantage of incapability of forming a contact hole with a relatively small hole diameter and cannot be applied to a product having a high resolution (for example, high pixels per inch (PPI)). In addition, generally, an etching solution used for etching silica contains a hydrofluoric acid, which would easily generate an irremovable stain on a back surface of a glass substrate and further affect execution of a subsequent process, such as Cell process alignment and a laser lift-off process of a flexible substrate.

SUMMARY

A main objective of the present invention is to provide an array substrate and a manufacturing method thereof, where an etching stop pattern or auxiliary conductive pattern of a patterned auxiliary conductive layer is electrically connected to a source/drain electrode and a heavily doped region, so as to alleviate influence of an unfavorable electrical property caused by that the heavily doped region is damaged by etching, thereby achieving objectives such as enhancing the uniformity of electrical properties and improving the production yield.

In order to achieve the foregoing objective, an embodiment of the present invention provides an array substrate, including a substrate, a patterned auxiliary conductive layer, a patterned semiconductor layer, a gate dielectric layer, and a first patterned conductive layer. The patterned auxiliary conductive layer and the patterned semiconductor layer are disposed over the substrate, the patterned auxiliary conductive layer includes two etching stop patterns, and the patterned semiconductor layer includes a channel region and two heavily doped regions. The channel region is located between two heavily doped regions, and each etching stop pattern is in direct contact with and overlaps one heavily doped region in a vertical projection direction. The gate dielectric layer is disposed over the patterned semiconductor layer and the patterned auxiliary conductive layer. The first patterned conductive layer is disposed over the gate dielectric layer, the first patterned conductive layer includes a gate, and the gate is disposed corresponding to the channel region in the vertical projection direction.

In order to achieve the foregoing objective, another embodiment of the present invention provides an array substrate, including a substrate, a patterned semiconductor layer, a gate dielectric layer, a first patterned conductive layer, an interlayer dielectric layer, a plurality of first openings, a patterned auxiliary conductive layer, and a second patterned conductive layer. The patterned semiconductor layer is disposed over the substrate, the patterned semiconductor layer includes a channel region and two heavily doped regions, and the channel region is located between the two heavily doped regions. a gate dielectric layer, disposed over the substrate and the patterned semiconductor layer; The first patterned conductive layer is disposed over the gate dielectric layer, the first patterned conductive layer includes a gate, and the gate is disposed corresponding to the channel region in the vertical projection direction. The interlayer dielectric layer is disposed over the gate dielectric layer and the first patterned conductive layer. Each first opening is disposed corresponding to one heavily doped region, and each first opening penetrates through the interlayer dielectric layer, the gate dielectric layer, and the corresponding heavily doped region. The patterned auxiliary conductive layer is disposed over the interlayer dielectric layer and in the first openings, the patterned auxiliary conductive layer includes two auxiliary conductive patterns, each auxiliary conductive pattern is conformally disposed in one first opening, and each auxiliary conductive pattern is in contact with the heavily doped region exposed by the corresponding first opening to form an electrical connection. The second patterned conductive layer is disposed over the patterned auxiliary conductive layer, the second patterned conductive layer includes two source/drain electrodes, one first opening is filled with each source/drain electrode, and each source/drain electrode forms an electrical connection to one heavily doped region by using the auxiliary conductive pattern in the corresponding first opening.

In order to achieve the foregoing objective, another embodiment of the present invention provides a manufacturing method of an array substrate, including the following steps. A patterned auxiliary conductive layer is formed over a substrate, where the patterned auxiliary conductive layer includes two etching stop patterns. A patterned semiconductor layer is formed over the substrate, where the patterned semiconductor layer includes a channel region and two heavily doped regions, the channel region is located between the two heavily doped regions, and each etching stop pattern is in direct contact with and overlaps one heavily doped region in a vertical projection direction. A gate dielectric layer is formed over the patterned semiconductor layer and the patterned auxiliary conductive layer. A first patterned conductive layer is formed over the gate dielectric layer, where the first patterned conductive layer includes a gate, and the gate corresponds to the channel region in the vertical projection direction.

In order to achieve the foregoing objective, another embodiment of the present invention provides a manufacturing method of an array substrate, including the following steps. A patterned semiconductor layer is formed over a substrate, where the patterned semiconductor layer includes a channel region and two heavily doped regions, and the channel region is located between the two heavily doped regions. A gate dielectric layer is formed over the substrate and the patterned semiconductor layer. A first patterned conductive layer is formed over the gate dielectric layer, where the first patterned conductive layer includes a gate, and the gate corresponds to the channel region in the vertical projection direction. An interlayer dielectric layer is formed over the gate dielectric layer and the first patterned conductive layer. A plurality of first openings is formed, where each first opening corresponds to one heavily doped region, and each first opening penetrates through the interlayer dielectric layer, the gate dielectric layer, and the corresponding heavily doped region. A patterned auxiliary conductive layer is formed over the interlayer dielectric layer and in the first openings, the patterned auxiliary conductive layer includes two auxiliary conductive patterns, each auxiliary conductive pattern is conformally formed in one first opening, and each auxiliary conductive pattern is in contact with the heavily doped region exposed by the corresponding first opening to form an electrical connection. The second patterned conductive layer is formed over the patterned auxiliary conductive layer, the second patterned conductive layer includes two source/drain electrodes, one first opening is filled with each source/drain electrode, and each source/drain electrode forms an electrical connection to one heavily doped region by using the auxiliary conductive pattern in the corresponding first opening.

BRIEF DESCRIPTION OF THE DRAWINGS

FIG. 2 shows a schematic diagram of the manufacturing method following FIG. 1;

FIG. 3 shows a schematic diagram of the manufacturing method following FIG. 2;

FIG. 4 shows a schematic diagram of the manufacturing method following FIG. 3;

FIG. 5 shows a schematic diagram of the manufacturing method following FIG. 4;

FIG. 8 shows a schematic diagram of the manufacturing method following FIG. 7;

FIG. 9 shows a schematic diagram of the manufacturing method following FIG. 8;

DETAILED DESCRIPTION

In order to enable persons of ordinary skill in the art of the present invention to further understand the present invention, preferred embodiments of the present invention are specifically provided in the following text and the constitution content and to-be-produced effects of the present invention are described in detail with reference to the accompanying drawings.

Figure 1:
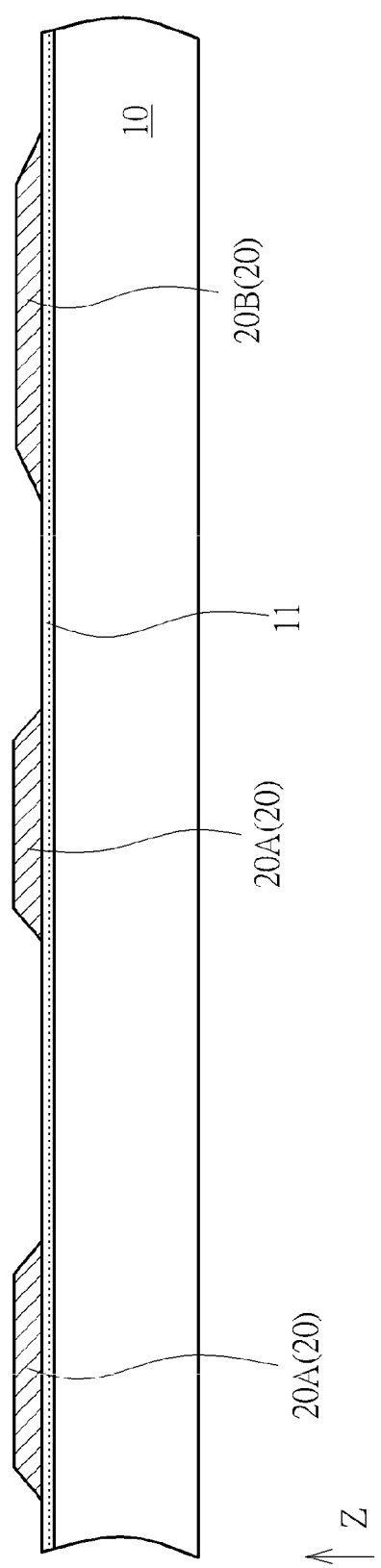
FIG. 1 to FIG. 5 show schematic diagrams of a manufacturing method of an array substrate according to a first embodiment of the present invention.

Please refer to FIG. 1 to FIG. 5. FIG. 1 to FIG. 5 show schematic diagrams of a manufacturing method of an array substrate according to a first embodiment of the present invention. In order to facilitate description, each drawing of the present invention is merely illustrative to make it easier for the present invention to be understood, and detailed proportions thereof can be adjusted according to requirements of design. A manufacturing method of an array substrate according to this embodiment includes the following steps. First, as shown in FIG. 1, a substrate 10 is provided, and the substrate 10 may include a hard substrate, such as a glass substrate and a ceramic substrate, or a flexible substrate, such as a plastic substrate, or a substrate formed from another suitable material. A patterned auxiliary conductive layer 20 is formed over the substrate 10, where the patterned auxiliary conductive layer 20 may include at least two etching stop patterns 20A. In addition, the patterned auxiliary conductive layer 20 of this embodiment may further include a third electrode 20B disposed apart from the etching stop patterns 20A, where the two etching stop patterns 20A are also disposed apart from each other. The patterned auxiliary conductive layer of this embodiment may be a single-layer or multi-layer structure, and materials thereof includes a metal, a metal oxide, an alloy, a transparent conductive material, a semiconductor material (for example, polycrystalline silicon, microcrystalline silicon, amorphous silicon, an oxide semiconductor, or another suitable material), or another suitable conductive material, or a combination of at least two of the foregoing materials. The foregoing metal material may include, for example, at least one of aluminum, copper, silver, chromium, titanium, and molybdenum, a composite layer of the foregoing material, a metal nitride of the foregoing material, a metal oxide of the foregoing material, or a metal oxynitride of the foregoing material, which, however, is not limited thereto. It should be noted that before the patterned auxiliary conductive layer 20 is formed, a buffer layer 11 may be selectively first formed over the substrate 10, which, however, is not limited thereto. A material of the buffer layer 11 may include silicon oxide, silicon nitride, silicon oxynitride, or another suitable insulation material.

Figure 2:
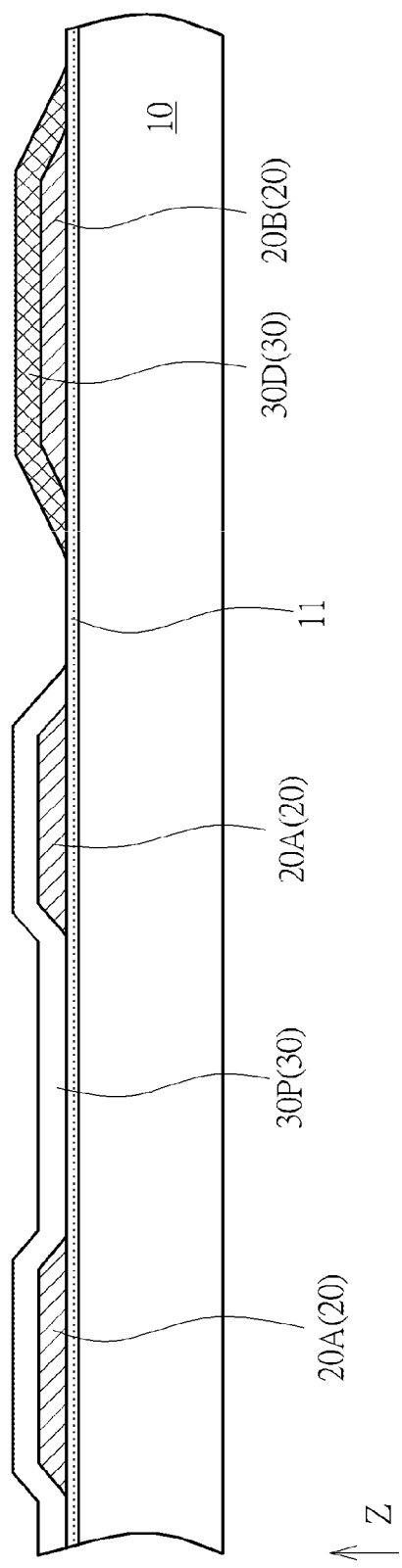

Then, as shown in FIG. 2, a patterned semiconductor layer 30 is formed over the substrate 10, and the patterned semiconductor layer 30 may include a semiconductor pattern 30P that is disposed corresponding to an etching stop pattern 20A. In this embodiment, the semiconductor pattern 30P covers the corresponding etching stop pattern 20A and a part of a region between the two etching stop patterns 20A. In another word, a region of a surface of the substrate 10 exposed by means of separation of the two etching stop patterns 20A is covered by the semiconductor pattern 30P, and the semiconductor pattern 30P extends to cover the two etching stop patterns 20A. In addition, the patterned semiconductor layer 30 may further include a first electrode 30D formed over the third electrode 20B of the patterned auxiliary conductive layer 20, and the third electrode 20B is in direct contact with and overlaps the first electrode 30D in a vertical projection direction Z, which, however, is not limited thereto. The first electrode 30D is separated from the patterned semiconductor layer 30. It should be noted that the first electrode 30D may be a pattern having relatively high conductivity after the patterned semiconductor layer 30 is subject to a local treatment. For example, the patterned semiconductor layer 30 may include a polycrystalline silicon semiconductor material, an oxide semiconductor material, or another suitable semiconductor material, or a composition of the materials, and the first electrode 30D may be a conductive pattern formed in a manner such as a local doping process or a local plasma treatment. The foregoing oxide semiconductor material may include a group II-VI compound (for example, zinc oxide, ZnO), a group II-VI compound doping with an alkaline earth metal (for example, magnesium-zinc oxide, ZnMgO), a group II-VI compound doping with an group IIIA element (for example, indium-gallium-zinc oxide, IGZO), a group II-VI compound doping with a group VA element (for example, tin-antimony oxide, SnSbO2), a group II-VI compound doping with a group VIA element (for example, zinc selenide oxide, ZnSeO), a group II-VI compound doping with a transition metal (for example, zinc-zirconium oxide, ZnZrO), or another oxide that is formed by mixing and combining the total element categories mentioned above and that has a semiconductor property, which, however, is not limited thereto.

Figure 3:
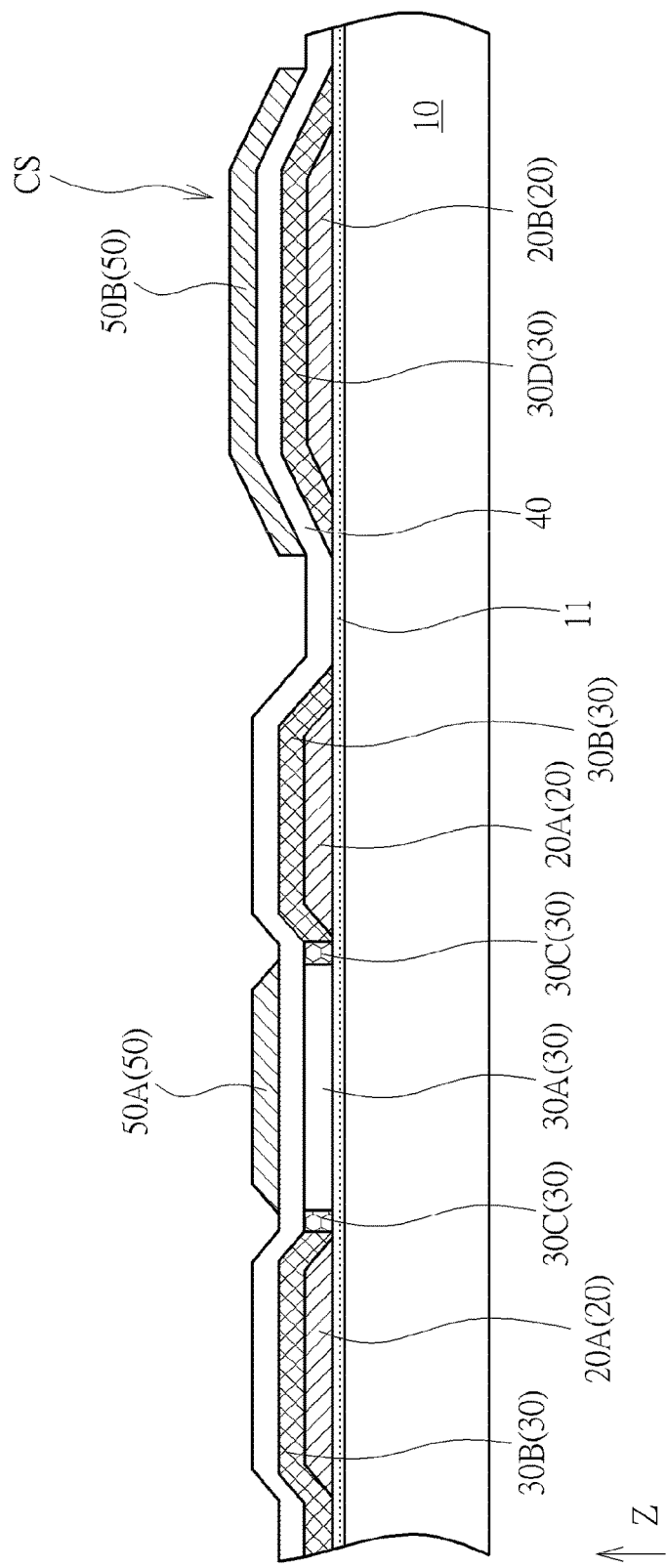

Subsequently, as shown in FIG. 2 to FIG. 3, a gate dielectric layer 40 is formed between the patterned semiconductor layer 30 and the patterned auxiliary conductive layer 20, and a first patterned conductive layer 50 is formed over the gate dielectric layer 40. The gate dielectric layer 40 may be a single-layer or multiple-layer-stacked structure formed from silicon oxide, silicon nitride, silicon oxynitride, or another suitable insulation material. The first patterned conductive layer 50 includes a gate 50A, disposed correspondingly to the semiconductor pattern 30P between the two etching stop patterns 20A. Then, another local treatment is performed to form two heavily doped regions 30B in the semiconductor pattern 30P, the semiconductor pattern 30P that is not affected by the local treatment becomes a channel region 30A, and the channel region 30A is located between the two heavily doped regions 30B. Each etching stop pattern 20A is in direct contact with and overlaps one heavily doped region 30B in a vertical projection direction Z. For example, when the patterned semiconductor layer 30 is a polycrystalline silicon layer, the heavily doped regions 30B may include a heavily doped region doped with a P-type dopant such as a boron ion or an N-type dopant such as a phosphorus ion, which, however, is not limited thereto. In addition, after the heavily doped regions 30B are formed, another local treatment may be selectively further utilized to form a lightly doped region 30C between the heavily doped region 30B and the channel region 30A, and the gate 50A corresponds to and overlaps the channel region 30A in the vertical projection direction Z. A doping concentration of the heavily doped region is greater than that of the lightly doped region, and a channel region is generally an intrinsic region, which, however, is not limited thereto. In this embodiment, the patterned auxiliary conductive layer 20 is formed before the patterned semiconductor layer 30, so each etching stop pattern 20A is located between the corresponding heavily doped region 30B and the substrate 10 in a vertical projection direction Z. In addition, the first patterned conductive layer 50 of this embodiment may be a single-layer or multi-layer structure and includes a metal, an alloy, a transparent conductive material, or another suitable conductive material, or a combination of at least two of the foregoing materials, and this metal may include, for example, at least one of aluminum, copper, silver, chromium, titanium, and molybdenum, a composite layer of the foregoing material, a metal nitride of the foregoing material, a metal oxide of the foregoing material, or a metal oxynitride of the foregoing material, which, however, is not limited thereto. It should be noted that the first patterned conductive layer 50 may further include a second electrode 50B, the first electrode 30D and the second electrode 50B overlap each other in the vertical projection direction Z, and a part of the gate dielectric layer 40 is disposed between the first electrode 30D and the second electrode 50B to form a storage capacitor CS.

Figure 4:
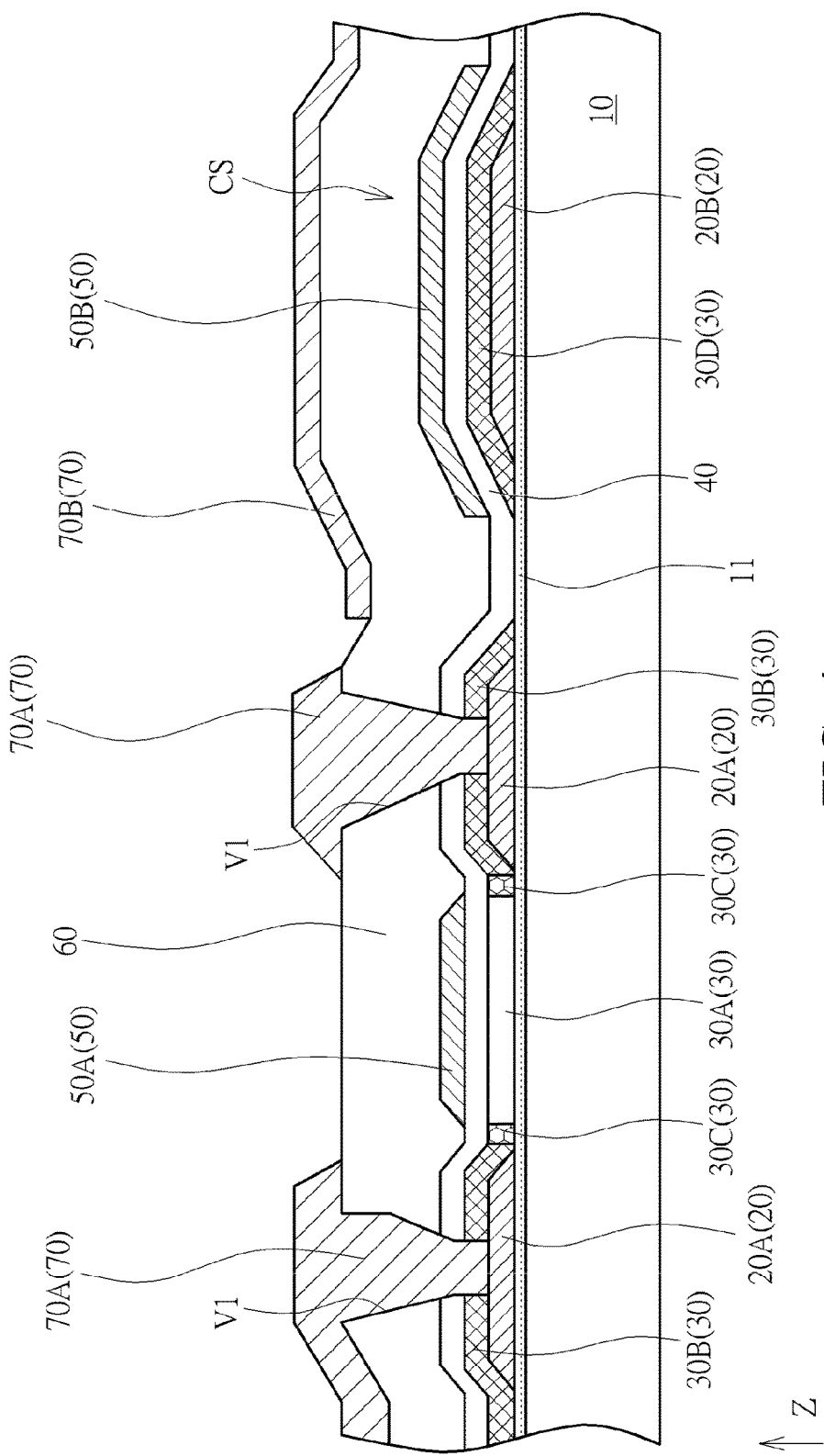

Then, as shown in FIG. 4, an interlayer dielectric layer 60 is formed over the gate dielectric layer 40 and the first patterned conductive layer 50. The interlayer dielectric layer 60 may be a single-layer or multiple-layer-stacked structure formed from silicon oxide, silicon nitride, silicon oxynitride, or another suitable dielectric material. Subsequently, a plurality of first openings V1 is formed by using, for example, a lithography etching process, and each first opening V1 corresponds to one etching stop pattern 20A. In this embodiment, each first opening V1 penetrates through the interlayer dielectric layer 60, the gate dielectric layer 40, and the patterned semiconductor layer 30 to at least partially expose the corresponding etching stop pattern 20A. It should be noted that each first opening V1 of this embodiment is preferably formed in a dry etching manner, which, however, is not limited thereto. Then, a second patterned conductive layer 70 is formed over the interlayer dielectric layer 60 and in the first openings V1, the second patterned conductive layer 70 includes two source/drain electrodes 70A, each source/drain electrode 70A corresponds to one etching stop pattern 20A, and each source/drain electrode 70A passes through at least one first opening V1 to come into contact with the corresponding etching stop pattern 20A to form an electrical connection. The two source/drain electrodes 70A are separated from each other. The second patterned conductive layer 70 of this embodiment may be a single-layer or multi-layer structure and includes a metal, an alloy, a transparent conductive material, or another suitable conductive material, or a combination of at least two of the foregoing materials, and this metal may include, for example, at least one of aluminum, copper, silver, chromium, titanium, and molybdenum, a composite layer of the foregoing material, a metal nitride of the foregoing material, a metal oxide of the foregoing material, or a metal oxynitride of the foregoing material, which, however, is not limited thereto. It should be noted that the second patterned conductive layer 70 may selectively further include a fourth electrode 70B, the fourth electrode 70B is disposed corresponding to the second electrode 50B in the vertical projection direction Z, by means of which the fourth electrode 70B, the second electrode 50B, and the interlayer dielectric layer 60 sandwiched therebetwen to form another storage capacitor, which, however, is not limited thereto.

Figure 5:
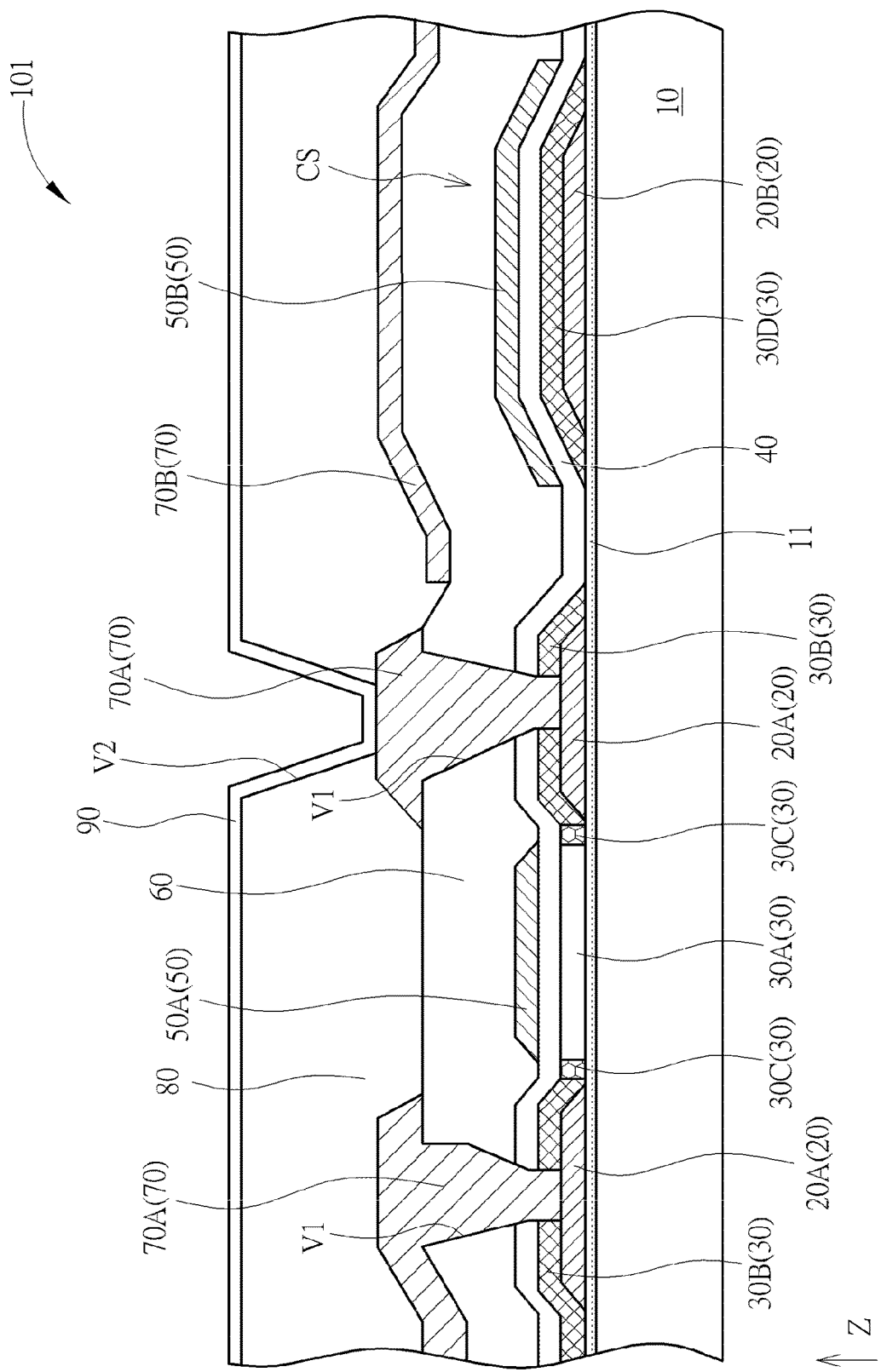

Subsequently, as shown in FIG. 5, a flat layer 80 is formed over the second patterned conductive layer 70 and the interlayer dielectric layer 60. The flat layer 80 is of a single-layer or multi-layer material, which may include an inorganic material (for example, silicon nitride, silicon oxide, and silicon oxynitride, or another suitable material), an organic material (for example, acrylic resin, a photoresist, a color filter material, or another suitable material), or another suitable material. Then, a second opening V2 is formed, the second opening V2 corresponds to one of the source/drain electrodes 70A, and the second opening V2 penetrates through the flat layer 80 to expose at least a part of the corresponding source/drain electrode 70A. Subsequently, a pixel electrode 90 is formed over the flat layer 80, and the pixel electrode 90 is in contact with the source/drain electrode 70A exposed by the second opening V2 to be connected thereto. By means of the the foregoing manufacturing method, an array substrate 101 as shown in FIG. 5 may be formed. In this embodiment, a material of the pixel electrode 90 may differ depending on a property of a display device to which the pixel electrode 90 is applied. For example, when the array substrate 101 is applied to a transmissive display device, the pixel electrode 90 is preferably made from a transparent conductive material such as indium oxide, when the array substrate 101 is applied to a non-transmissive display device, the pixel electrode 90 may be made from a non-transparent conductive material such as a metal or an alloy, and when the array substrate 101 is applied to a semi-transmissive display device, the pixel electrode 90 may be partially made from a non-transparent conductive material such as a metal or an alloy, and another part thereof may be formed from a transparent conductive material, which, however, is not limited thereto. Regardless of being of a specific type, for example, a liquid crystal display panel, an organic light-emitting display panel, or another suitable display device, or a combination of at least two of the foregoing display devices, the transmissive display device, non-transmissive display device, and semi-transmissive display device all can be applied. In this embodiment, because the etching stop pattern 20A having a conductive capability is disposed correspondingly below the heavily doped region 30B of the patterned semiconductor layer 30, when the first opening V1 is formed, it is less required to concern a degree by which the patterned semiconductor layer 30 is damaged by an etching process, and the first opening V1 may be enabled to directly penetrate through the patterned semiconductor layer 30 to directly expose a surface of the etching stop pattern 20A, and the source/drain electrode 70A may form an electrical connection to the heavily doped region 30B by using the etching stop pattern 20A having a conductive capability (for example, ohmic contact may be formed between the etching stop pattern 20A and the heavily doped region 30B), so the manufacturing method of this embodiment can achieve objectives such as enhancing the uniformity of electrical properties, increasing the process window, and improving the production yield.

As shown in FIG. 5, an array substrate 101 of this embodiment includes a substrate 10, a patterned auxiliary conductive layer 20, a patterned semiconductor layer 30, a gate dielectric layer 40, and a first patterned conductive layer 50. The patterned auxiliary conductive layer 20 and the patterned semiconductor layer 30 are disposed over the substrate 10, the patterned auxiliary conductive layer 20 includes two etching stop patterns 20A, and the patterned semiconductor layer 30 includes a channel region 30A and two heavily doped regions 30B. The channel region 30A is located between two heavily doped regions 30B, and each etching stop pattern 20A is in direct contact with and overlaps one heavily doped region 30B in a vertical projection direction Z. The gate dielectric layer 40 is disposed over the patterned semiconductor layer 30 and the patterned auxiliary conductive layer 20. The first patterned conductive layer 50 is disposed over the gate dielectric layer 40, the first patterned conductive layer 50 includes a gate 50A, and the gate 50A is disposed corresponding to the channel region 30A in the vertical projection direction Z. In this embodiment, the patterned auxiliary conductive layer 20 is disposed between the substrate 10 and the patterned semiconductor layer 30, and the etching stop pattern 20A is disposed between the heavily doped region 30B and the substrate 10. In addition, the array substrate 101 may further include an interlayer dielectric layer 60, a first opening V1, a second patterned conductive layer 70, a flat layer 80, a second opening V2, and a pixel electrode 90. The interlayer dielectric layer 60 is disposed over the gate dielectric layer 40 and the first patterned conductive layer 50, each first opening V1 is disposed corresponding to one etching stop patterns 20A, each first opening V1 penetrates through the interlayer dielectric layer 60, the gate dielectric layer 40, and the patterned semiconductor layer 30 to at least partially expose the corresponding etching stop pattern 20A. The second patterned conductive layer 70 is disposed over the interlayer dielectric layer 60 and in the first opening V1, the second patterned conductive layer 70 includes two source/drain electrodes 70A, each source/drain electrode 70A is disposed corresponding to one etching stop pattern 20A, and each source/drain electrode 70A passes through at least one first opening V1 to come into contact with the corresponding etching stop pattern 20A to form an electrical connection. The flat layer 80 is disposed over the second patterned conductive layer 70 and the interlayer dielectric layer 60, the second opening V2 is disposed corresponding to one source/drain electrode 70A, and the second opening V2 penetrates through the flat layer 80 to expose at least a part of the corresponding source/drain electrode 70A. The pixel electrode 90 is disposed over the flat layer 80, and the pixel electrode 90 is in contact with the source/drain electrode 70A exposed by the second opening V2 to form an electrical connection. A material property of each component in the array substrate 101 is described in the foregoing manufacturing method, and therefore, is not described again therein. It should be noted that because the patterned semiconductor layer 30 of this embodiment is formed after the patterned auxiliary conductive layer 20, the third electrode 20B of the patterned auxiliary conductive layer 20 is disposed between the first electrode 30D and the substrate 10.

Description is performed for different embodiments of the present invention in the following, and in order to simplify the description, differences between the embodiments are mainly described in detail in the following, and the same ones would not be described again. In addition, the same components in the embodiments of the present invention are marked with the same reference signs, so as to facilitate comparison between the embodiments.

Figure 6:
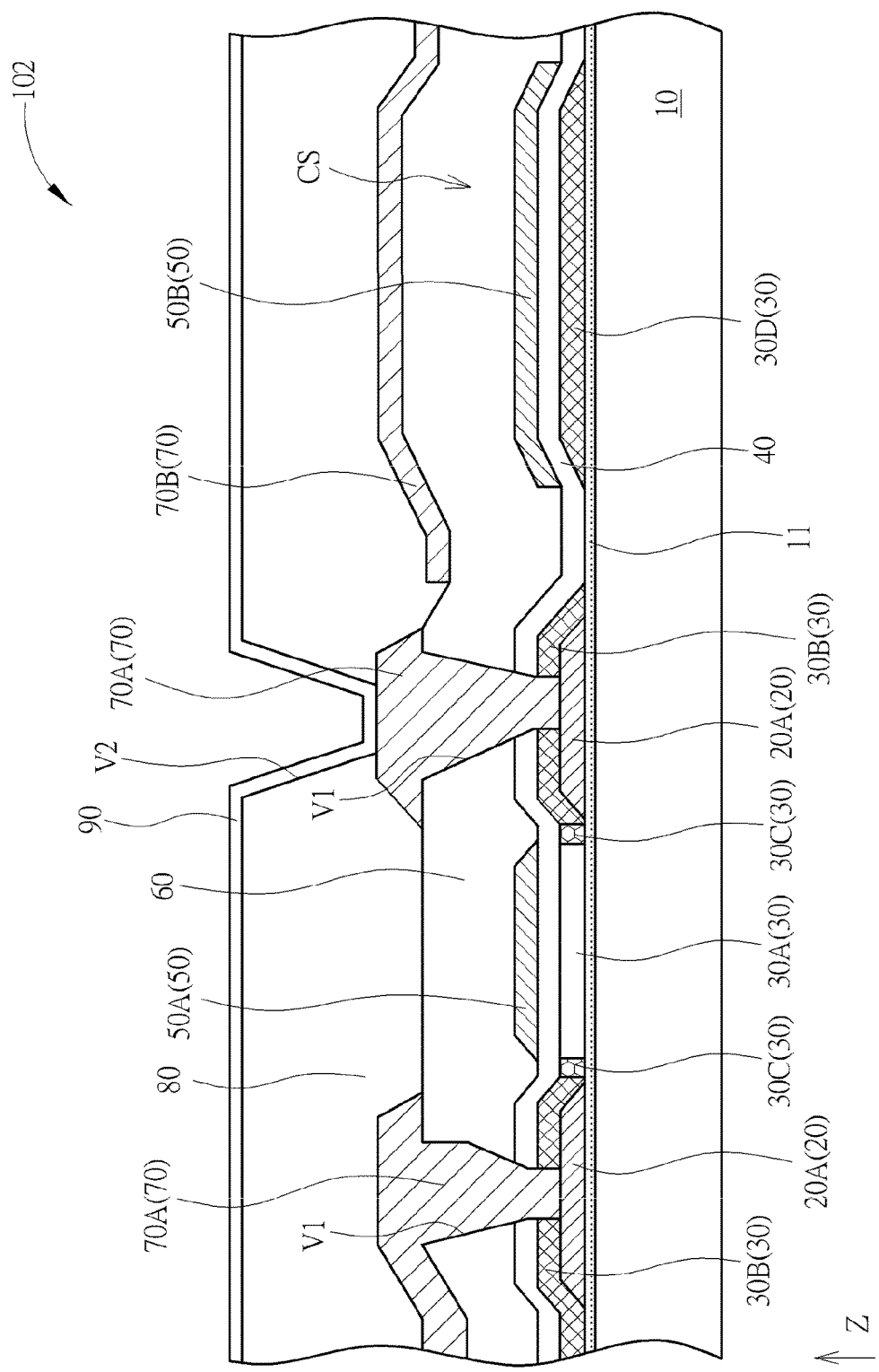
FIG. 6 shows a schematic diagram of an array substrate according to a second embodiment of the present invention.

Please refer to FIG. 6. FIG. 6 shows a schematic diagram of an array substrate according to a second embodiment of the present invention. As shown in FIG. 6, an array substrate 102 of this embodiment differs from the foregoing first embodiment, a patterned auxiliary conductive layer 20 of the array substrate 102 does not have the third electrode 20B of the foregoing first embodiment, so a storage capacitor CS of this embodiment may only be formed from a first electrode 30D and a second electrode 50B of the patterned semiconductor layer 30 and a gate dielectric layer 40 sandwiched therebetween.

Figure 7:
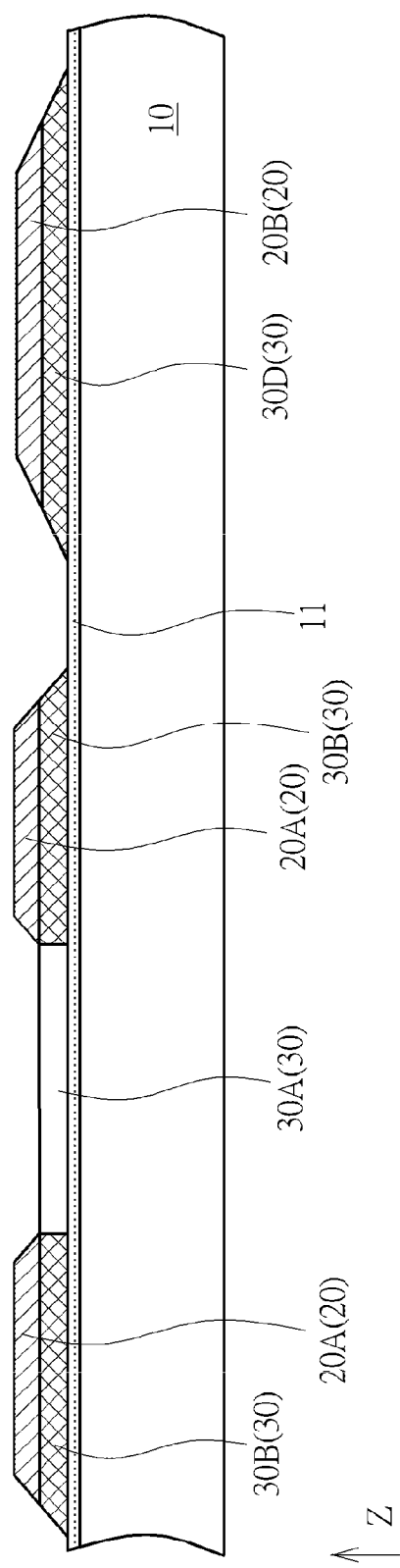
FIG. 7 to FIG. 9 show schematic diagrams of a manufacturing method of an array substrate according to a third embodiment of the present invention.
Figure 8:
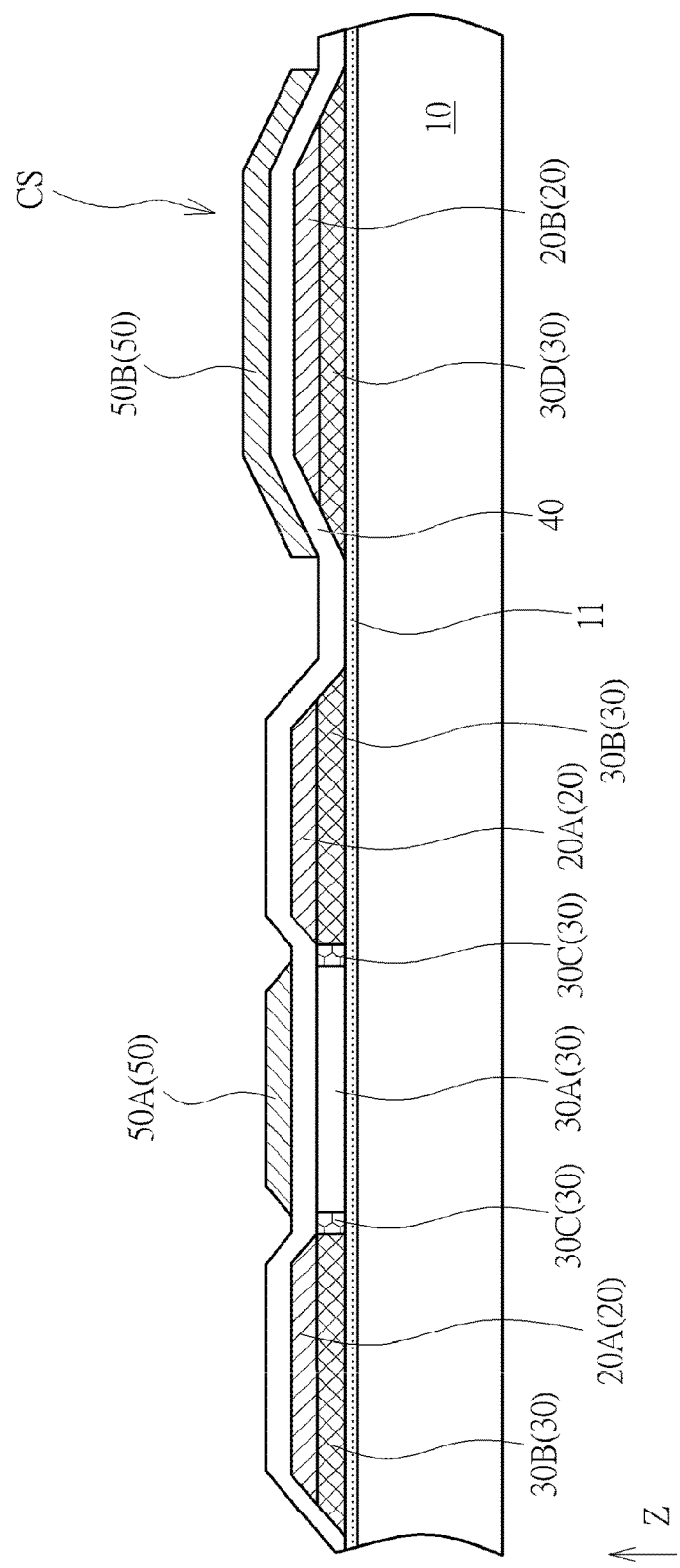
Figure 9:
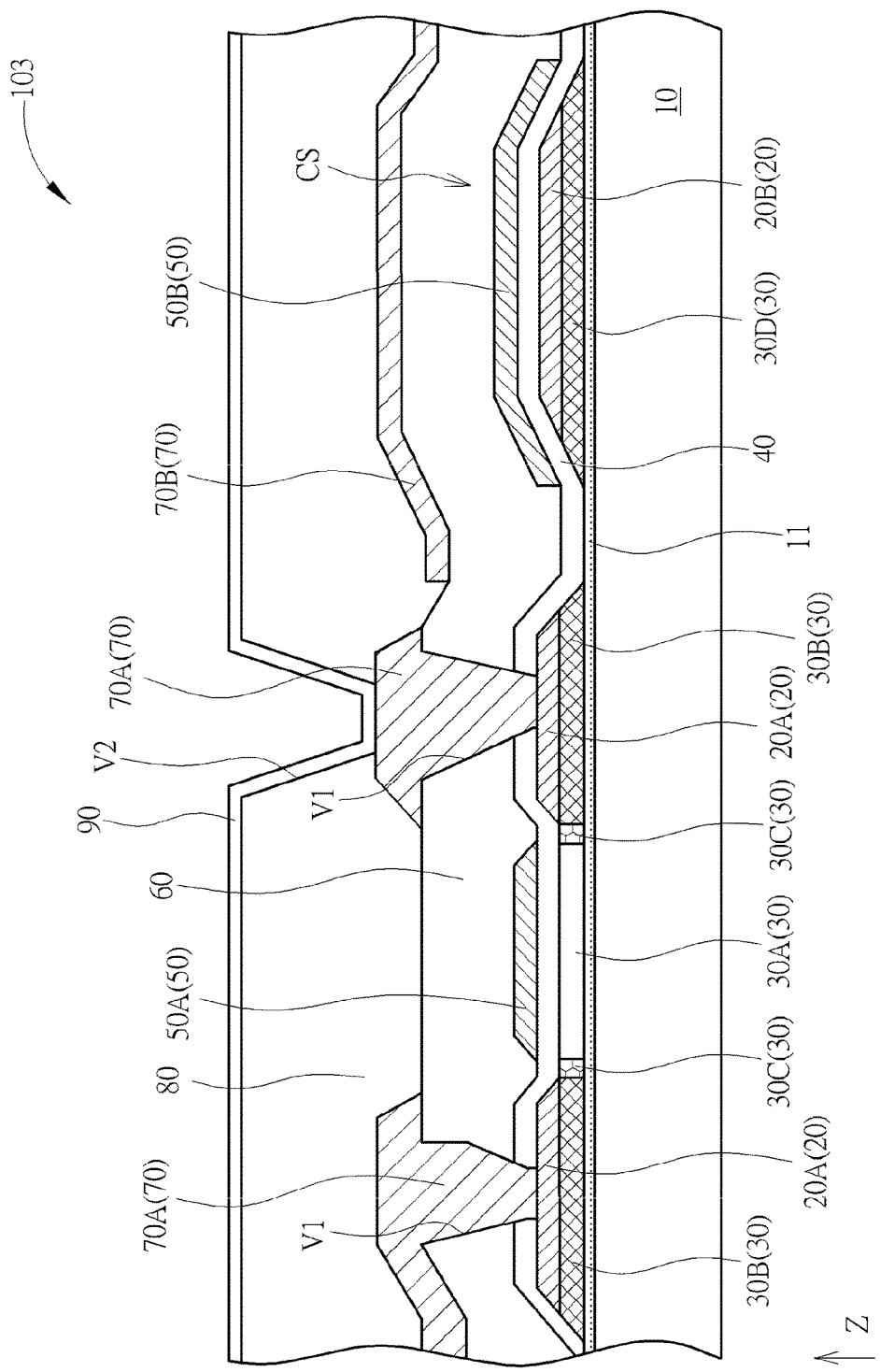

Please refer to FIG. 7 to FIG. 9. FIG. 7 to FIG. 9 show schematic diagrams of a manufacturing method of an array substrate according to a third embodiment of the present invention. Different from the first embodiment, as shown in FIG. 7, the patterned auxiliary conductive layer 20 of this embodiment is formed after the patterned semiconductor layer 30, and each heavily doped region 30B is located between a corresponding etching stop pattern 20A and a substrate 10 in a vertical projection direction. In addition, the heavily doped region 30 and first electrode 30D of this embodiment may be formed together by means of the same local treatment, for example, an ion implantation process, depending on requirements, which, however, is not limited thereto. Subsequently, as shown in FIG. 8, a gate dielectric layer 40 and a first patterned conductive layer 50 are formed, and a lightly doped region 30C is formed between the heavily doped region 30B and a channel region 30A by further utilizing another local treatment. Then, as shown in FIG. 9, an interlayer dielectric layer 60, a first opening V1, a second patterned conductive layer 70, a flat layer 80, a second opening V2, and a pixel electrode 90 are subsequently formed, and further, an array substrate 103 as shown in FIG. 9 is formed. Different from the array substrate of the foregoing first embodiment, in the array substrate 103 of this embodiment, because the patterned auxiliary conductive layer 20 is formed after the patterned semiconductor layer 30, the patterned semiconductor layer 30 is disposed between the substrate 10 and the patterned auxiliary conductive layer 20, and the etching stop pattern 20A is disposed over the heavily doped region 30B. Therefore, an etching process for forming the first opening V1 in this embodiment stays on the etching stop pattern 20A and the heavily doped region 30B of the patterned semiconductor layer 30 would not be etched, so the heavily doped region 30B can be protected by the etching stop pattern 20A and would not be damaged. In addition, the first electrode 30D is disposed between the third electrode 20B of the patterned auxiliary conductive layer 20 and the substrate 10, so the storage capacitor CS of this embodiment may be formed by the first electrode 30D, the third electrode 20B, the gate dielectric layer 40, and the second electrode 50B that are stacked over one another in sequence.

Figure 10:
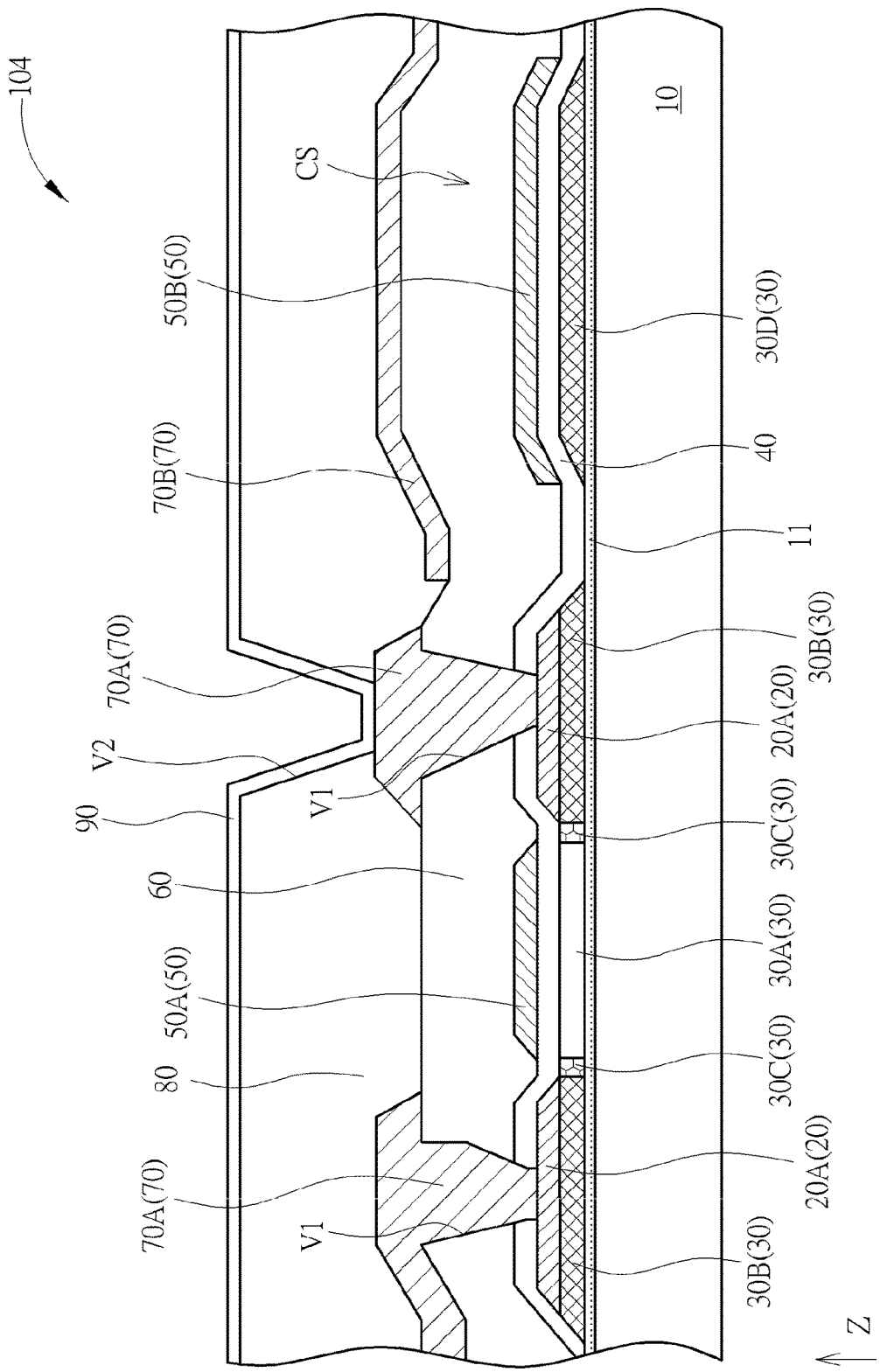
FIG. 10 shows a schematic diagram of an array substrate according to a fourth embodiment of the present invention.

Please refer to FIG. 10. FIG. 10 shows a schematic diagram of an array substrate according to a fourth embodiment of the present invention. As shown in FIG. 10, an array substrate 104 of this embodiment differs from the foregoing third embodiment, a patterned auxiliary conductive layer 20 of the array substrate 104 does not have the third electrode 20B of the foregoing third embodiment, so a storage capacitor CS of this embodiment may only be formed from a first electrode 30D and a second electrode 50B of the patterned semiconductor layer 30 and a gate dielectric layer 40 sandwiched therebetween.

Figure 11:
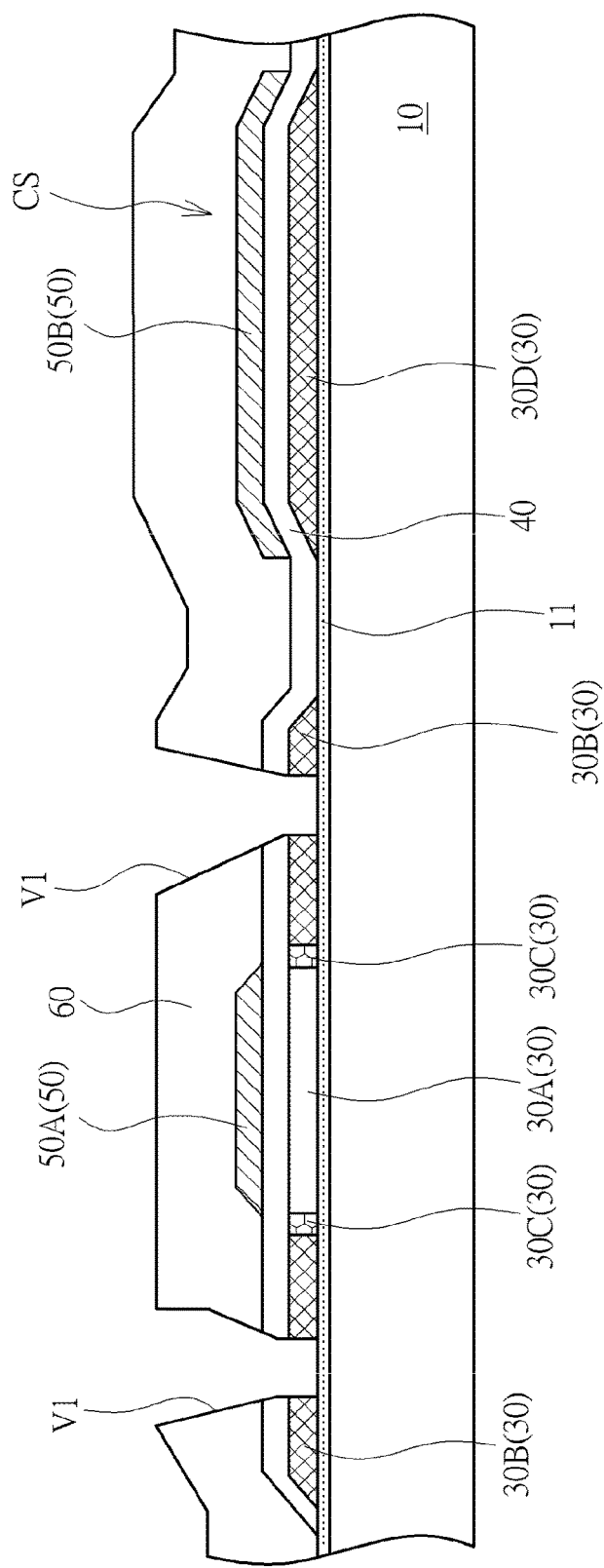
FIG. 11 and FIG. 12 show schematic diagrams of a manufacturing method of an array substrate according to a fifth embodiment of the present invention.
Figure 12:
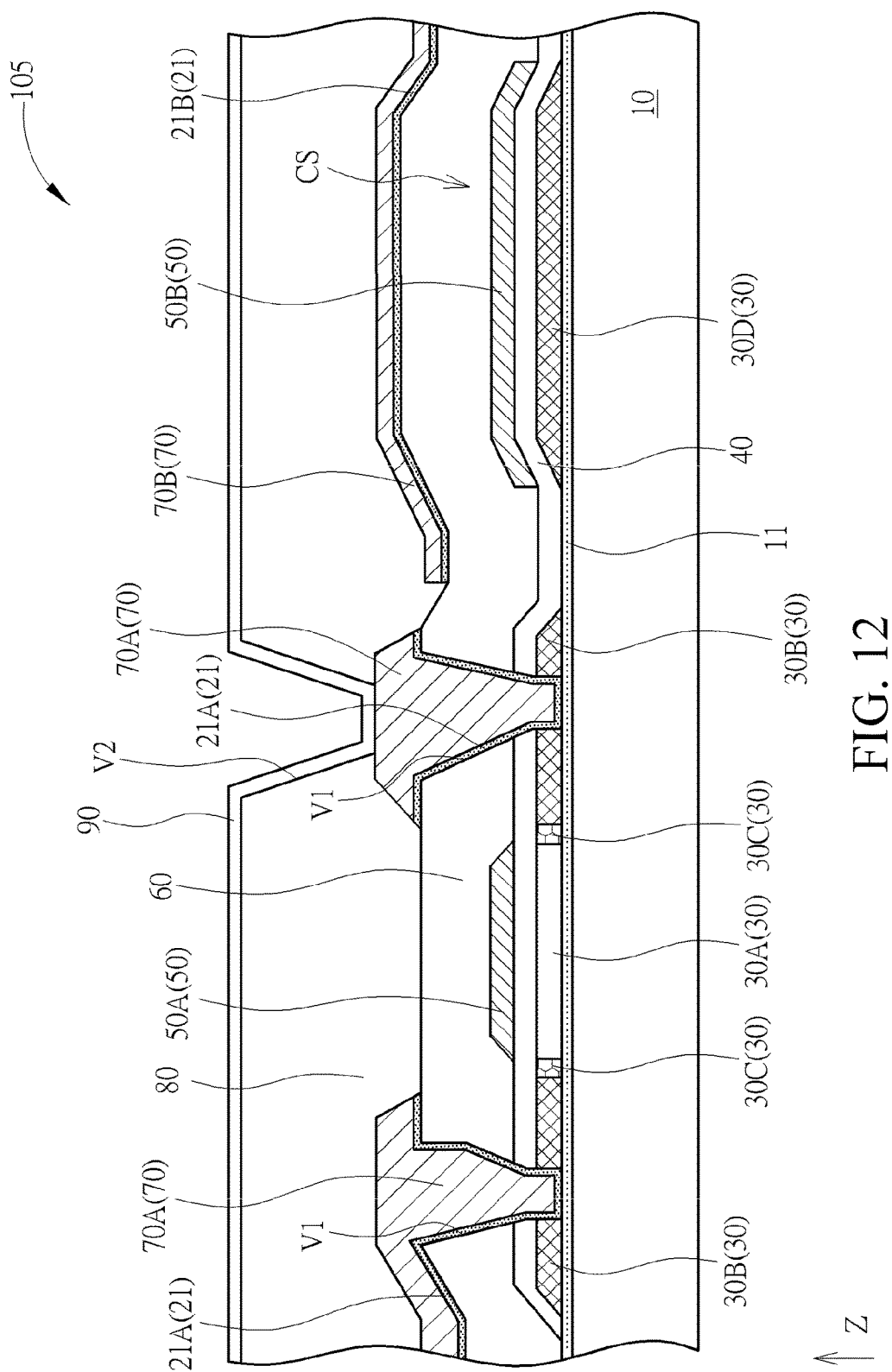

Please refer to FIG. 11 and FIG. 12. FIG. 11 and FIG. 12 show schematic diagrams of a manufacturing method of an array substrate according to a fifth embodiment of the present invention. A manufacturing method of an array substrate according to this embodiment includes the following steps. First, as shown in FIG. 11, a patterned semiconductor layer 30 is formed over a substrate 10, and the patterned semiconductor layer 30 includes a channel region 30A and two heavily doped regions 30B, and the channel region 30A is located between the two heavily doped regions 30B. In addition, the patterned semiconductor layer 30 may further include a first electrode 30D formed over the substrate 10, and the first electrode 30D may be a pattern having relatively high conductivity after the patterned semiconductor layer 30 is subject to a local treatment. For example, the patterned semiconductor layer 30 may include a polycrystalline silicon semiconductor material, an oxide semiconductor material, or another suitable semiconductor material, or a composition of the materials, and the first electrode 30D may be a conductive pattern formed in a manner such as a local doping process or local plasma treatment. It should be noted that before the patterned auxiliary conductive layer 20 is formed, a buffer layer 11 may be selectively first formed over the substrate 10, which, however, is not limited thereto. A material of the buffer layer 11 may include silicon oxide, silicon nitride, silicon oxynitride, or another suitable insulation material. Subsequently, a gate dielectric layer 40 is formed over the substrate 10 and the patterned semiconductor layer 30, and a first patterned conductive layer 50 is formed over the gate dielectric layer 40. It should be noted that the gate dielectric layer 40 may further cover the first electrode 30D. The first patterned conductive layer 50 includes a gate 50A, and the gate 50A corresponds to and overlaps the channel region 30A in a vertical projection direction Z. Subsequently, a lightly doped region 30C may be formed between the heavily doped region 30B and the channel region 30A by further utilizing another local treatment. A doping concentration of the heavily doped region is greater than that of the lightly doped region, and a channel region is generally an intrinsic region, which, however, is not limited thereto. It should be noted that the first patterned conductive layer 50 may further include a second electrode 50B, the first electrode 30D and the second electrode 50B overlap each other in the vertical projection direction Z, and a part of the gate dielectric layer 40 is disposed between the first electrode 30D and the second electrode 50B to form a storage capacitor CS. Then, an interlayer dielectric layer 60 is formed between the gate dielectric layer 40 and the first patterned conductive layer 50, a plurality of the first opening V1 is formed, each first opening V1 corresponds to one heavily doped region 30B, and each first opening V1 penetrates through the interlayer dielectric layer 60, the gate dielectric layer 40, and the corresponding heavily doped region 30B to expose a surface of the substrate 10. It should be noted that the gate dielectric layer 60 may further cover the second electrode 50B.

Subsequently, as shown in FIG. 12, a patterned auxiliary conductive layer 21 is formed over the interlayer dielectric layer 60 and in the first openings V1, and a second patterned conductive layer 70 is formed over the patterned auxiliary conductive layer 21. The second patterned conductive layer 70 is in direct contact with an upper surface of the patterned auxiliary conductive layer 21. In this embodiment, the patterned auxiliary conductive layer 21 includes two auxiliary conductive patterns 21A, each auxiliary conductive pattern 21A is conformally formed in one first opening, and each auxiliary conductive pattern 21A is in contact with the heavily doped region 30B exposed by the corresponding first opening V1 to form an electrical connection. The second patterned conductive layer 70 includes two source/drain electrodes 70A, one first opening V1 is filled with each source/drain electrode 70A, and each source/drain electrode 70A forms an electrical connection to one heavily doped region 30B by using the auxiliary conductive pattern 21A in the corresponding first opening V1. In this embodiment, the patterned auxiliary conductive layer 21 may preferably include a heavily doped polycrystalline silicon layer, microcrystalline silicon layer, or amorphous silicon layer, or another suitable conductive material, or metal oxide material or a combination of at least two of the foregoing materials, and the patterned auxiliary conductive layer 21 and the second patterned conductive layer 70 may be formed together by using the same patterning process, for example, a yellow light etching process, by means of which an effect of simplifying a process is produced, which, however, is limited thereto. In another embodiment of this embodiment, the patterned auxiliary conductive layer 21 and the second patterned conductive layer 70 may also be separately formed by means of different patterning processes depending on requirements. In addition, when the patterned auxiliary conductive layer 21 and the second patterned conductive layer 70 are formed together by using the same yellow light etching process, and shapes of the patterned auxiliary conductive layer 21 and the second patterned conductive layer 70 are generally the same as each other in the vertical projection direction Z. In this case, the patterned auxiliary conductive layer 21 may further include a fifth electrode 21B disposed between a fourth electrode 70B of the second patterned conductive layer 70 and the interlayer dielectric layer 60, that is, the fourth electrode 70B is in direct contact with an upper surface of the fifth electrode 21B. Therefore, the interlayer dielectric layer 60 is disposed between the fifth electrode 21B and the second electrode 50B to form another storage capacitor CS.

Subsequently, a flat layer 80, a second opening V2, and a pixel electrode 90 may be further formed, and further, an array substrate 105 as shown in FIG. 12 is formed. The flat layer 80 is formed over the second patterned conductive layer 70 and the interlayer dielectric layer 60, the second opening V2 corresponds to one source/drain electrode 70A, and the second opening V2 penetrates through the flat layer 80 to expose at least a part of the corresponding source/drain electrode 70A. The pixel electrode 90 is formed over the flat layer 80, and the pixel electrode 90 is in contact with the source/drain electrode 70A exposed by the second opening V2 to form an electrical connection. It should be noted that the flat layer 80 may further cover the fourth electrode 70B.

As shown in FIG. 12, the array substrate 105 of this embodiment includes a substrate 10, a buffer layer 11, a patterned semiconductor layer 30, a gate dielectric layer 40, a first patterned conductive layer 50, an interlayer dielectric layer 60, a plurality of first openings V1, a patterned auxiliary conductive layer 21, and a second patterned conductive layer 70. The patterned semiconductor layer 30 is disposed over the substrate 10, the patterned semiconductor layer 30 includes a channel region 30A and two heavily doped regions 30B, and the channel region 30A is located between the two heavily doped regions 30B. The gate dielectric layer 40 is disposed over the substrate 10 and the patterned semiconductor layer 30. The first patterned conductive layer 50 is disposed over the gate dielectric layer 40, the first patterned conductive layer 50 includes a gate 50A, and the gate 50A is disposed corresponding to the channel region 30A in a vertical projection direction Z. The interlayer dielectric layer 60 is disposed over the gate dielectric layer 40 and the first patterned conductive layer 50. Each first opening V1 is disposed corresponding to one heavily doped region 30B, and each first opening V1 penetrates through the interlayer dielectric layer 60, the gate dielectric layer 40, and the corresponding heavily doped region 30B. The patterned auxiliary conductive layer 21 is disposed over the interlayer dielectric layer 60 and in the first openings V1, the patterned auxiliary conductive layer 21 includes two auxiliary conductive patterns 21A, each auxiliary conductive pattern 21A is conformally disposed in one first opening V1, and each auxiliary conductive pattern 21A is in contact with the heavily doped region 30B exposed by the corresponding first opening V1 to form an electrical connection. The second patterned conductive layer 70 is disposed over the patterned auxiliary conductive layer 21, the second patterned conductive layer 70 includes two source/drain electrodes 70A, one first opening V1 is filled with each source/drain electrode 70A, and each source/drain electrode 70A forms an electrical connection to one heavily doped region 30B by using the auxiliary conductive pattern 21A in the corresponding first opening V1. In addition, the array substrate 105 may further include a flat layer 80A, a second opening V2, and a pixel electrode 90. The flat layer 80 is disposed over the second patterned conductive layer 70 and the interlayer dielectric layer 60, the second opening V2 is disposed corresponding to one source/drain electrode 70A, and the second opening V2 penetrates through the flat layer 80 to expose at least a part of the corresponding source/drain electrode 70A. The pixel electrode 90 is disposed over the flat layer 80, and the pixel electrode 90 is in contact with the source/drain electrode 70A exposed by the second opening V2 to form an electrical connection. In addition, the array substrate 105 may further include a storage capacitor CS, and the storage capacitor CS may formed by a first electrode 30D of the patterned semiconductor layer 30, a second electrode 50B of the first patterned conductive layer 50, and the gate dielectric layer 40 sandwiched between the first electrode 30D and the second electrode 50B, which, however, is not limited thereto. It should be noted that the interlayer dielectric layer 60 is disposed between a fifth electrode 21B and the second electrode 50B to form another storage capacitor CS.

In this embodiment, because the source/drain electrode 70A forms an electrical connection to the heavily doped region 30 by using the auxiliary conductive pattern 21A, and the auxiliary conductive pattern 21A may preferably be of a conductive material the same as that if the heavily doped region 30B, for example, a heavily doped polycrystalline silicon layer, even if the heavily doped region 30B is etched when during an etching process for forming the first openings V1, there is still a favorable conducting state between the auxiliary conductive pattern 21A and the heavily doped region 30B. In addition, because the patterned auxiliary conductive layer 21 and the second patterned conductive layer 70 are formed together by means of the same yellow light etching process, contact surfaces of the source/drain electrode 70A and the auxiliary conductive pattern 21A are not damaged by the etching and may maintain a favorable contact state (for example, the ohmic contact).

In another word, in this embodiment, an electric connection state between the source/drain electrode 70A and the heavily doped region 30B may be ensured by disposing the auxiliary conductive pattern 21A, so that it is less required to concern a degree by which the patterned semiconductor layer 30 is damaged when the first openings V1 are formed. Hence, the manufacturing method of this embodiment can achieve objectives such as enhancing the uniformity of electrical properties, increasing the process window, and improving the production yield.

In conclusion, in an array substrate and a manufacturing method thereof in the present invention, an etching stop pattern or auxiliary conductive pattern of a patterned auxiliary conductive layer is electrically connected to a source/drain electrode and a heavily doped region, so as to alleviate influence of an unfavorable electrical property caused by that the heavily doped region is damaged by etching, thereby achieving objectives such as enhancing the uniformity of electrical properties, increasing the process window, and improving the production yield.

The foregoing are merely preferred embodiments of the present invention, and equivalent alternation and modification made according to the claims of the present invention are covered by the present invention.

What is claimed is:
1. An array substrate, comprising:
 a substrate;
 a patterned auxiliary conductive layer, disposed over the substrate, wherein the patterned auxiliary conductive layer comprises two etching stop patterns;
 a patterned semiconductor layer, disposed over the substrate, wherein the patterned semiconductor layer comprises a channel region and two heavily doped regions, the channel region is located between the two heavily doped regions, and each of the etching stop patterns is in direct contact with and overlaps one of the heavily doped regions in a vertical projection direction;
 a gate dielectric layer, disposed over the patterned semiconductor layer and the patterned auxiliary conductive layer; and a first patterned conductive layer, disposed over the gate dielectric layer, wherein the first patterned conductive layer comprises a gate, and the gate is disposed corresponding to the channel region in the vertical projection direction.

wherein the patterned auxiliary conductive layer is disposed between the substrate and the patterned semiconductor layer.

2. The array substrate according to claim 1, wherein the patterned semiconductor layer is disposed between the substrate and the patterned auxiliary conductive layer.

3. The array substrate according to claim 1, wherein the patterned auxiliary conductive layer comprises a metal, or a metal oxide conductive layer, or both the metal and the metal oxide conductive layer.

4. An array substrate, comprising:
a substrate;
a patterned auxiliary conductive layer, disposed over the substrate, wherein the patterned auxiliary conductive layer comprises two etching stop patterns;
a patterned semiconductor layer, disposed over the substrate, wherein the patterned semiconductor layer comprises a channel region and two heavily doped regions, the channel region is located between the two heavily doped regions, and each of the etching stop patterns is in direct contact with and overlaps one of the heavily doped regions in a vertical projection direction;
a gate dielectric layer, disposed over the patterned semiconductor layer and the patterned auxiliary conductive layer;
a first patterned conductive layer, disposed over the gate dielectric layer, wherein the first patterned conductive layer comprises a gate, and the gate is disposed corresponding to the channel region in the vertical projection direction;
an interlayer dielectric layer, disposed over the gate dielectric layer and the first patterned conductive layer;
a plurality of first openings, wherein each of the first openings is disposed to a corresponding etching stop pattern, and each of the first openings penetrates through the interlayer dielectric layer and the gate dielectric layer to at least partially expose the corresponding etching stop pattern; and
a second patterned conductive layer, disposed over the interlayer dielectric layer and in the first openings, wherein the second patterned conductive layer comprises two source/drain electrodes, each of the source/drain electrodes is disposed corresponding to one of the etching stop patterns, and each of the source/drain electrodes passes through at least one of the first openings to come into contact with the corresponding etching stop pattern to form an electrical connection.

5. The array substrate according to claim 4, wherein the patterned auxiliary conductive layer is disposed between the substrate and the patterned semiconductor layer, and each of the first openings further penetrates through the patterned semiconductor layer.

6. An array substrate, comprising:
a substrate;
a patterned auxiliary conductive layer, disposed over the substrate, wherein the patterned auxiliary conductive layer comprises two etching stop patterns;
a patterned semiconductor layer, disposed over the substrate, wherein the patterned semiconductor layer comprises a channel region, two heavily doped regions, and a first electrode, and where the channel region is located between the two heavily doped regions, and each of the etching stop patterns is in direct contact with and overlaps one of the heavily doped regions in a vertical projection direction;
a gate dielectric layer, disposed over the patterned semiconductor layer and the patterned auxiliary conductive layer; and
a first patterned conductive layer, disposed over the gate dielectric layer, wherein the first patterned conductive layer comprises a gate and a second electrode, and the gate is disposed corresponding to the channel region in the vertical projection direction, and wherein the first electrode and the second electrode overlap each other in the vertical projection direction, and a part of the gate dielectric layer is disposed between the first electrode and the second electrode to form a storage capacitor.

7. The array substrate according to claim 4, further comprising:
a flat layer, disposed over the second patterned conductive layer and the interlayer dielectric layer;
a second opening, disposed corresponding to one of source/drain electrodes, wherein the second opening penetrates through the flat layer to expose at least a part of the corresponding source/drain electrode; and
a pixel electrode, dispose over the flat layer, wherein the pixel electrode is in contact with the source/drain electrode exposed by the second opening to form an electrical connection.

8. The array substrate according to claim 6, wherein the patterned auxiliary conductive layer further comprises a third electrode, and the third electrode is in direct contact with and overlaps the first electrode in the vertical projection direction.

9. The array substrate according to claim 8, wherein the third electrode is disposed between the first electrode and the substrate.

10. The array substrate according to claim 8, wherein the first electrode is disposed between the third electrode and the substrate.

11. An array substrate, comprising:
a substrate;
a patterned semiconductor layer, disposed over the substrate, wherein the patterned semiconductor layer comprises a channel region and two heavily doped regions, and the channel region is located between the two heavily doped regions;
a gate dielectric layer, disposed over the substrate and the patterned semiconductor layer;
a first patterned conductive layer, disposed over the gate dielectric layer, wherein the first patterned conductive layer comprises a gate, and the gate is disposed corresponding to the channel region in a vertical projection direction;
an interlayer dielectric layer, disposed over the gate dielectric layer and the first patterned conductive layer;
a plurality of first openings, wherein each of the first openings is disposed corresponding to one of the heavily doped regions, and each of the first openings penetrates through the interlayer dielectric layer, the gate dielectric layer, and a corresponding heavily doped region of the two heavily doped regions;
a patterned auxiliary conductive layer, disposed over the interlayer dielectric layer and in the first openings, comprising two auxiliary conductive patterns, wherein each of the auxiliary conductive patterns is conformally disposed in one of the first openings in order to be in contact with the heavily doped region; and a second patterned conductive layer, disposed over the patterned auxiliary conductive layer, wherein the second patterned conductive layer comprises two source/drain electrodes, one of the first openings is filled with each of the source/drain electrodes, and each of the source/drain electrodes connects to one of the heavily doped regions by using the auxiliary conductive pattern in the corresponding first opening.

12. The array substrate according to claim 11, wherein the patterned auxiliary conductive layer comprises a heavily doped polycrystalline silicon layer, or a microcrystalline silicon layer, or an amorphous silicon layer.

13. The array substrate according to claim 11, further comprising:
   a flat layer, disposed over the second patterned conductive layer and the interlayer dielectric layer;
   a second opening, disposed to one of the source/drain electrodes, wherein the second opening penetrates through the flat layer to expose at least a part of the one of the source/drain electrodes; and
   a pixel electrode, dispose over the flat layer, wherein the pixel electrode is in contact with the one of the source/drain electrodes exposed by the second opening.

14. A manufacturing method of an array substrate, comprising:
   forming a patterned auxiliary conductive layer over a substrate, wherein the patterned auxiliary conductive layer comprises two etching stop patterns;
   forming a patterned semiconductor layer over the substrate, wherein the patterned semiconductor layer comprises a channel region and two heavily doped regions, the channel region is located between the two heavily doped regions, and each of the etching stop patterns is in direct contact with and overlaps one of the heavily doped regions in a vertical projection direction;
   forming a gate dielectric layer over the patterned semiconductor layer and the patterned auxiliary conductive layer; and
   forming a first patterned conductive layer over the gate dielectric layer, wherein the first patterned conductive layer comprises a gate, and the gate corresponds to the channel region in the vertical projection direction.

15. The manufacturing method of the array substrate according to claim 14, wherein the patterned auxiliary conductive layer is formed before the patterned semiconductor layer, and each of the etching stop patterns is located between a corresponding heavily doped region and the substrate in the vertical projection direction.

16. The manufacturing method of the array substrate according to claim 14, wherein the patterned auxiliary conductive layer is formed after the patterned semiconductor layer, and each of the heavily doped regions is located between a corresponding etching stop pattern and the substrate in the vertical projection direction.

17. The manufacturing method of the array substrate according to claim 14, further comprising:
   forming an interlayer dielectric layer over the gate dielectric layer and the first patterned conductive layer;
   forming a plurality of first openings, wherein each of the first openings corresponds to one of the etching stop patterns, and each of the first openings penetrates through the interlayer dielectric layer and the gate dielectric layer to at least partially expose a corresponding etching stop pattern; and
   forming a second patterned conductive layer over the interlayer dielectric layer and in the first openings, wherein the second patterned conductive layer comprises two source/drain electrodes, each of the source/drain electrodes corresponds to one of the etching stop patterns, and each of the source/drain electrodes passes through at least one of the first openings to come into contact with the corresponding etching stop pattern to form an electrical connection.

18. The manufacturing method of the array substrate according to claim 17, wherein the patterned auxiliary conductive layer is formed before the patterned semiconductor layer, and each of the first openings further penetrates through the patterned semiconductor layer.

19. The manufacturing method of the array substrate according to claim 14, wherein the patterned auxiliary conductive layer comprises a metal, or a metal oxide conductive layer, or both the metal and the metal oxide conductive layer.

20. The manufacturing method of the array substrate according to claim 17, further comprising:
   forming a flat layer over the second patterned conductive layer and the interlayer dielectric layer;
   forming a second opening corresponding to one of source/drain electrodes, and the second opening penetrates through the flat layer to expose at least a part of the one of source/drain electrodes; and
   forming a pixel electrode over the flat layer, wherein the pixel electrode is in contact with the one of source/drain electrodes exposed by the second opening.

21. A manufacturing method of the array substrate, comprising:
   Forming a substrate;
   forming a patterned semiconductor layer over the substrate, wherein the patterned semiconductor layer comprises a channel region and two heavily doped regions, and the channel region is located between the two heavily doped regions;
   forming a gate dielectric layer over the substrate and the patterned semiconductor layer;
   forming a first patterned conductive layer over the gate dielectric layer, wherein the first patterned conductive layer comprises a gate, and the gate corresponds to the channel region in a vertical projection direction;
   forming an interlayer dielectric layer over the gate dielectric layer and the first patterned conductive layer;
   forming a plurality of first openings, wherein each of the first openings corresponds to one of the heavily doped regions, and each of the first openings penetrates through the interlayer dielectric layer, the gate dielectric layer, and the one of the heavily doped regions;
   forming a patterned auxiliary conductive layer over the interlayer dielectric layer and in the first openings, wherein the patterned auxiliary conductive layer comprises two auxiliary conductive patterns, each of the auxiliary conductive patterns is conformally formed in one of the first openings, and each of the auxiliary conductive patterns is in contact with a corresponding heavily doped regions exposed by a corresponding first opening; and
   forming a second patterned conductive layer over the patterned auxiliary conductive layer, wherein the second patterned conductive layer comprises two source/drain electrodes, one of the first openings is filled with each of the source/drain electrodes, and each of the source/drain electrodes connects to the corresponding heavily doped region by using the auxiliary conductive pattern in the corresponding first opening.

22. The manufacturing method of the array substrate according to claim 21, wherein the patterned auxiliary conductive layer comprises a heavily doped polycrystalline silicon layer, or a microcrystalline silicon layer, or an amorphous silicon layer.

23. The manufacturing method of the array substrate according to claim 21, further comprising:
- forming a flat layer over the second patterned conductive layer and the interlayer dielectric layer;
- forming a second opening, wherein the second opening corresponds to one of the source/drain electrodes, and the second opening penetrates through the flat layer to expose at least a part of the one of the corresponding source/drain electrodes; and
- forming a pixel electrode over the flat layer, wherein the pixel electrode is in contact with the one of the source/drain electrodes exposed by the second opening.

* * * * *